United States Patent [19]

Kitano et al.

[11] Patent Number: 4,667,325
[45] Date of Patent: May 19, 1987

[54] METHOD AND APPARATUS OF SCANNING CONTROL FOR INFORMATION PROCESSING SYSTEMS

[75] Inventors: Masahiro Kitano; Katsuro Wakai, both of Hadano; Masahiro Hashimoto, Sagamihara, all of Japan

[73] Assignee: Hitachi, Ltd., Tokyo, Japan

[21] Appl. No.: 578,793

[22] Filed: Feb. 10, 1984

[30] Foreign Application Priority Data

Mar. 4, 1983 [JP] Japan .................................. 58-34510

[51] Int. Cl.$^4$ ............................................. G06F 11/00
[52] U.S. Cl. ........................................ 371/25; 371/27
[58] Field of Search ..................... 371/25, 27; 364/200

[56] References Cited

U.S. PATENT DOCUMENTS

| 3,614,608 | 10/1971 | Giedd | 371/25 X |
| 3,675,217 | 7/1972 | Dauber | 364/200 |
| 3,723,976 | 3/1973 | Alvarez | 364/200 |
| 4,451,918 | 3/1984 | Gillette | 371/27 |
| 4,554,664 | 11/1985 | Schultz | 371/25 |

FOREIGN PATENT DOCUMENTS 56336  5/1979  Japan .................................. 371/25

OTHER PUBLICATIONS

J. P. Roth "IBM Technical Disclosure Bulletin" vol. 25, No. 3A, Aug. 1982, pp. 1266-1267.
B. C. Rosales "IBM Technical Disclosure Bulletin" vol. 25, No. 25, Oct. 1982, pp. 2311-2313.

Primary Examiner—Jerry Smith
Assistant Examiner—Robert W. Beausoliel, Jr.
Attorney, Agent, or Firm—Antonelli, Terry & Wands

[57] ABSTRACT

A scanning control apparatus operates to scan-in arbitrary data to data storage elements such as registers, flip-flops and memory devices in an information processing system, and also scan-out data held in the data storage elements. The data storage elements are provided with physical scanning addresses determined in accordance with the arrangement of packaging, and further provided with logical scanning addresses. In the scanning operation for storage elements, a logical scanning address is given, and the scanning control apparatus transforms the logical scanning address into physical scanning addresses, by which storage elements rendered scan-in or scan-out are selected.

8 Claims, 2 Drawing Figures

METHOD AND APPARATUS OF SCANNING CONTROL FOR INFORMATION PROCESSING SYSTEMS

BACKGROUND OF THE INVENTION

The present invention relates to a method and apparatus of scanning control for information processing systems.

An effective method of maintenance and diagnosis for information processing systems which has widely been employed conventionally is the scan-in/scan-out control system. Scanning is defined to be a special data storage access operation, in which data storage elements, such as registers, flip-flops and memory devices in the processing system, are given specific addresses (scanning addresses) in advance and these storage elements are addressed for writing in predetermined values (scan-in) or reading out the contents (scan-out) in accordance with scanning logic independently of the normal logic operation.

This technique is applied, for example, to micro-diagnosis in which a diagnosis controller carries out scan-in and scan-out for a storage element and compares read-out data with the reference value so as to diagnose the logical operation of the element, and to a logging operation in which the states of registers, flip-flops and memory devices at the time of failure are read out to an external memory unit for analyzing the failure.

Due to a large number of logic circuits integrated within a chip, which has been achieved by recent advances in semiconductor technology, it is difficult to observe individual logic signals from outside using a logic scope and the like, and therefore, the scanning operation which can directly access logic circuits has become a desirable ojective.

In the conventional scanning system, a scanning address is assigned to each data storage element such that logically related flip-flops are provided with a common scanning address and word registers related closely in a logical sense are provided with consecutive addresses for the convenience of hardware and software using the scanning operation.

However, in many cases, such logical conditions do not match the packaging conditions of, for example, LSI chips and package boards. Namely, logical assignment of the scanning address invites the need for additional logic gates. In some extreme cases, logical assignment of the scanning address is degraded to a split address assignment, that tends to increase the complexity of the diagnosis controller. In addition, a change in the logical design directly affects the assignment of the scanning address, and frequent alterations of the scanning address result in an increased manpower in designing hardware and software systems.

SUMMARY OF THE INVENTION

It is an object of the present invention to provide a control apparatus for a scanning operation in which both the logical scanning address and physical scanning address are assigned to data storage elements.

Another object of the present invention is to provide a control method for a scanning operation which takes place on the basis of the logical scanning address and physical scanning address.

According to one aspect of the present invention, data storage elements, such as flip-flops, registers and memory devices, are provided with physical addresses in accordance with the structure of the packaging, and further provided with logically edited scanning addresses. In the scanning operation, a logical scanning address is given, and the scan controller generates a corresponding physical address by which scan-in or scan-out is carried out.

DESCRIPTION OF THE PREFERRED EMBODIMENT

Figure 1:
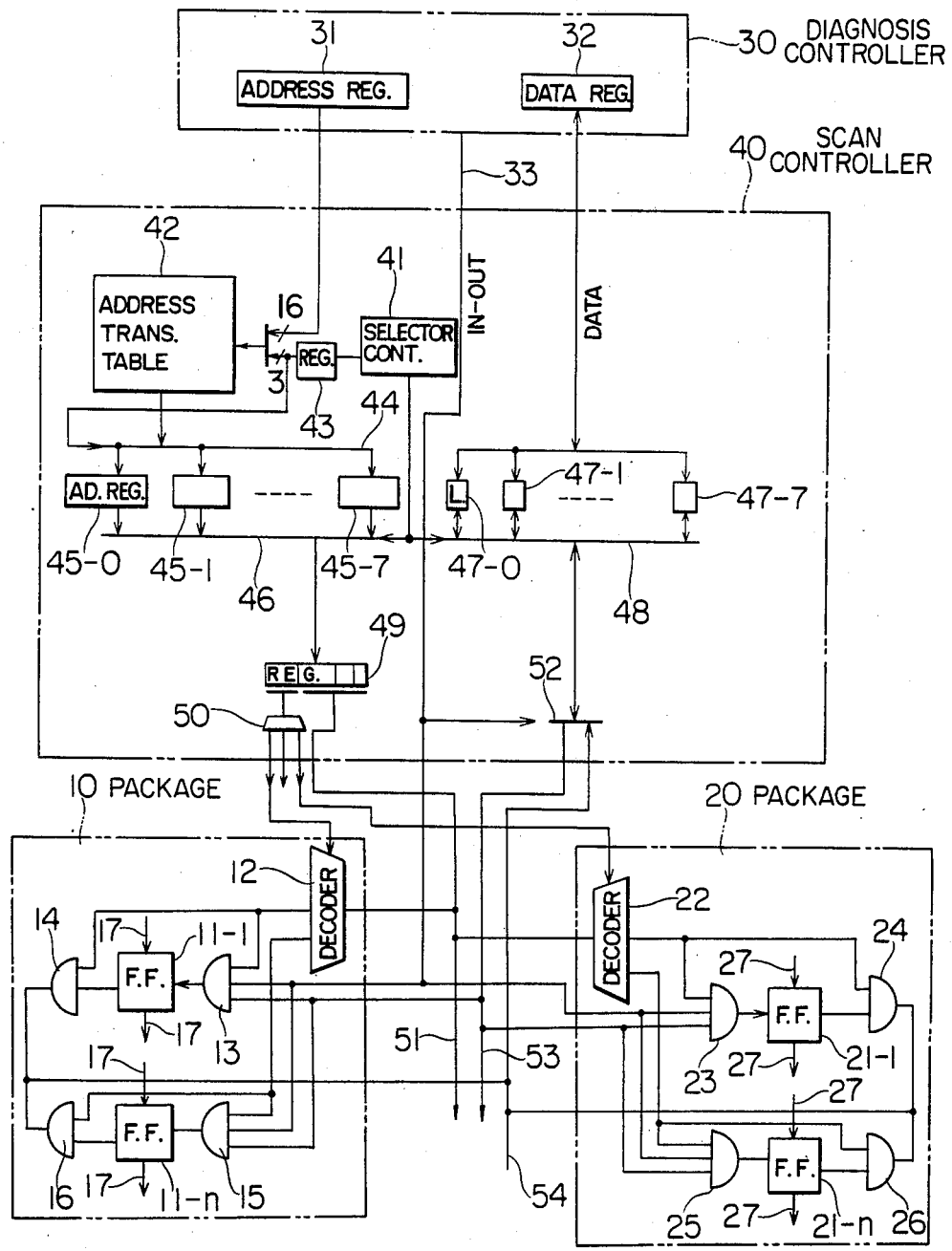
FIG. 1 is a block diagram showing one embodiment of the present invention.

One embodiment of the present invention will now be described in detail with reference to the drawings. An information processing system is generally constructed on a plurality of package boards each mounting a number of LSI chips to form logic circuits, and in FIG. 1 these packages are represented by the two packages 10 and 20. The package 10 includes data storage elements (e.g., flip-flops), 11-1 through 11-n each storing one bit of data, so that, for example, a 1-byte register is constituted by eight flip-flops 11. The figure shows only connections related to the scan-in and scan-out operations, and connections for implementing general data processing unrelated to the present invention are simply represented by lines 17 and 27. The flip-flop 11-1 is connected to scan-in AND gate 13 and scan-out AND gate 14, and the flip-flop 11-n is connected to scan-in AND gate 15 and scan-out AND gate 16. One of the AND gates 13 to 16 is selected by decoder 12. The package 20 has the same circuit arrangement of logic components and the reference numbers of the elements thereof are similar to those or the package 10, but are increased by 10.

Diagnosis controller 30 implements the diagnostic functions for the information processing system. In the inventive arrangement, the scanning address is set in register 31 and a signal indicative of scan-in or scan-out is provided on line 33, "1" for scan-in and "0" for scan-out. Data register 32 is a 1-byte (8 bits) register for storing 1-byte of scan-in data. Scanning controller 40 receives a logical scanning address from the address register 31 from the diagnosis controller 30, and it is fed to address translation table 42. Byte selection controller 41 increments the contents of a 3-bit register 43 sequentially from 0 to 7. The address translation table 42 produces eight physical scanning addresses from a logical scanning address provided by the register 31 for the higher-order section and a three-bit address (0–7) from the register 43 for the lower-order section (which represents 8 addresses) of the logical address.

Figure 2:
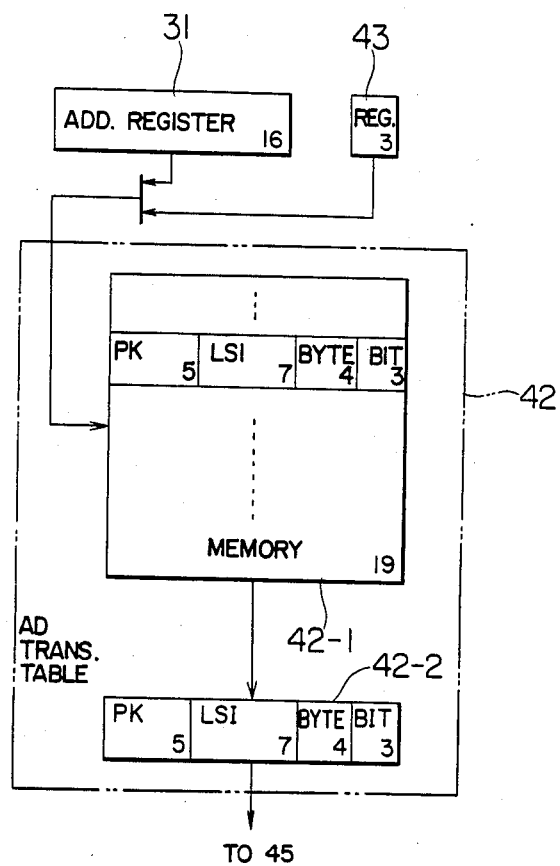
Fig. 2 is a detailed block diagram of the address translation table shown in FIG. 1.

FIG. 2 shows the scheme of scanning address translation and the format of the address translation table 42. The register 31 is loaded with a 16-bit logical scanning address. Each address is assigned to eight bits of storage elements, and a maximum of 64K (1K=1024) scanning addresses can be assigned. Memory 42-1 of the address translation table 42 is addressed by both the contents of the 3-bit register 43 forming the lower-order address section and the contents of the register 31 forming the higher-order address section to read out the memory contents, which is loaded to a register 42-2 and then fed to address register group 45 shown in FIG. 1. The scanning controller 40 reads out the memory 42-1 sequentially while incrementing the contents of the register 43, and stores the read-out eight physical addresses sequentially in the address registers 45-0 through 45-7 specified by the selector 44 in accordance with the contents of the register 43.

A physical scanning address is divided into a 5-bit PK (package) section, 7-bit LSI section, 4-bit BYTE section, and 3-bit BIT section, and is used for control purposes. The number of bits of each section is not essential to the present invention and can of course be varied. The PK section indicates the package number and up to 32 packages can be defined by 5 bits. The LSI section indicates the LSI number within each package, and up to 128 LSI chips can be defined by 7 bits. The BYTE and BIT sections in combination indicates the bit number for flip-flops within each LSI chip, and up to 128 flip-flops in each chip can be defined by 7 bits. The logical scanning address and the physical scanning address are assigned to data storage elements such as flip-flops as described below. Let us assume a one-byte register having a logical meaning in it and corresponding to eight flip-flops, i.e., four (11-1, 11-2, 11-3 and 11-4) of them in the package 10 and the remainder (21-1, 21-2, 21-3 and 21-4) in the package 20 in an LSI chip.

One-word logical scanning address, for example, (0000000000000001) in the binary expression, is assigned to the eight flip-flops. The physical scanning address assigned to each of the eight flip-flops has a constitution of sections of PK, LSI, BYTE and BIT. The BIT section has three bits.

The following table shows an example of a set of binary bit formats of the eight physical addresses.

| flip-flop | logical address | PK (18-14) | LSI (13-7) | BYTE (6-3) | BIT (2-0) |
| --- | --- | --- | --- | --- | --- |
| 11-1 | 0000000000000001 | 00001 | 0000001 | 0001 | 000 |
| 11-2 | 0000000000000001 | 00001 | 0000001 | 0001 | 001 |
| 11-3 | 0000000000000001 | 00001 | 0000001 | 0001 | 010 |
| 11-4 | 0000000000000001 | 00001 | 0000001 | 0001 | 011 |
| 21-1 | 0000000000000001 | 00010 | 0000001 | 0110 | 000 |
| 21-2 | 0000000000000001 | 00010 | 0000001 | 0110 | 001 |
| 21-3 | 0000000000000001 | 00010 | 0000001 | 0110 | 010 |
| 21-4 | 0000000000000001 | 00010 | 0000001 | 0110 | 011 |

The outstanding feature of the invention resides in the fact that the hardware structure of the packages or LSI chips is taken into consideration when determining the physical scanning address. Therefore, the scanning address can be transmitted systematically to each logic section. Namely, each package has input signal lines including 14 signals of the LSI, BYTE and BIT sections plus one package select signal decoded from the signals of the PK section, and each LSI chip has input signal lines including seven signals of the BYTE and BIT sections plus one chip select signal. In contrast, the conventional logical scanning address, when employed in this arrangement, would need 19 signal lines for each package or LSI chip. This comparison indicates a great advantage of the inventive system. Although a large number of decoders are needed to produce scanning address signals, they can have the same logic arrangement, and thus can be configured using only one type of LSI according to this invention. In the conventional logical scanning system, as each package has to be specified by its own decoder logic, several tens of LSIs of different types are necessary.

Returning to FIG. 1, the address register group 45 includes eight registers 45-0 through 45-7 storing eight physical scanning addresses produced by the address translation table 42. Latch group 47 includes eight latches 47-0 through 47-7 corresponding to respective registers in the address register group 45. The latch group 47 stores 1-byte of data from the data register 32. The byte selection controller 41 controls the selectors 46 and 48 so as to select one set of address and data from the address register group 45 and latch group 47 on a bit-by-bit basis. The physical scanning address from the address register group 45 is loaded into register 49. The 5-bit PK section of the physical scanning address in the register 49 is decoded by decoder 50, and a decoded package select signal is sent to a package addressed by the PK section. Other common address signals are sent over scanning address bus 51 and 1-bit data is sent over scan-in data line 53. In response to the signal on the line 33 indicating scan-in, selector 52 sends bit data from the latch group 47 over the scan-in data line 53.

The operation is as follows. The high-order section of a logical scanning address and 1-byte of scan-in data are loaded into the address register 31 and data register 32, respectively. The scanning controller 40 supplies the logical scanning address in the address register 31 and the address in the register 43 to the address translation table 42, and stores the 1-byte of data in the data register 32 into the latch group 47. The address translation table 42 produces from each received logical scanning address eight physical scanning addresses each corresponding to a bit of the 1-byte data stored in the data register 32. The eight physical scanning addresses produced by the address translation table 42 are stored in the address register group 45. One of eight physical scanning addresses in the address register group 45 and one of eight bits of data in the latch group 47 are selected in pair, and the physical scanning address is sent over the scanning address bus 51 and the bit of data is sent over the scan-in data line 53. The physical scanning address on the scanning address bus 51 is fed to the decoders 12 and 22 on the packages 10 and 20. Only one of the decoders 12 and 22 is selected at one time by the output of the decoder 50, and the selected decoder 12 or 22 decodes the physical scanning address on the scanning address bus 51. For example, when the decoder 12 is enabled, it decodes the scanning address on the bus 51, and if the physical scanning address on the bus 51 points to the flip-flop 11-1, the decoder 12 provides "1" to the AND gates 13 and 14. The signal line 33 provides "1" during scan-in mode, causing the AND gate 13 to transmit the bit of data on the scan-in data line 53, and it is set into the flip-flop 11-1. Following the scan-in operation for the address register 45-0 in accordance with the physical scanning address as described above, the scan-in operation for the address register 45-1 in accordance with the physical scanning address takes place in the same way, and thus the scan-in operations using eight physical scanning addresses take place sequentially.

In the scan-out operation, a high-order section of the logical scanning address is loaded into the address register 31 and it is converted to a physical scanning address by the address translation table 42 as in the case of the scan-in operation. The scanning address is decoded by the decoder 12 or 22 so as to select one of the outputs of the flip-flops, and the decoder outputs are connected to the inputs of the AND gates such as 14 and 16 for sending bit data onto scan-out data line 54. The scanning controller 40 operates to read out the contents of flip-flops to be monitored through the scan-out data line 54 into the latch group 47 on a bit-by-bit basis. After a byte of data has been read out, the 1-byte scan data is loaded into the register 32, and then is delivered to the scan-out calling unit.

In the above description, the scanning controller 40 receives the 16-bit logical address from the diagnosis controller 30 and delivers eight 19-bit physical addresses. Another apparatus may be provided instead of the described apparatus in which the scanning controller receives a 19-bit logical address from the diagnosis controller and delivers a 19-bit physical address, i.e., the register 43 may be omitted in the scan controller 40.

According to the present invention, the physical scanning address can be defined in accordance with the arrangement of the packaging. In contrast to the conventional system in which each package and LSI chip requires redundant address input signals when bits of a byte belong to separate LSIs or packages, the present invention reduces the redundancy of address input signals by separating the physical scanning address and the logical scanning address. In addition, the logical scanning address can be determined first, and this allows short-term development of control systems handling frequent scanning operations, and minimizes the difference among models of control systems.

We claim:

1. A scanning control apparatus for an information processing system comprising:
   diagnostic control means generating a logical scanning address;
   conversion means generating a physical scanning address in response to said logical scanning address from said diagnostic control means;
   selection means selecting one of the data storage elements in said information processing system in response to said physical scanning address from said conversion means; and
   means operative to scan-in or scan-out data to or from a data storage element selected by said selection means.

2. A scanning control apparatus according to claim 1, wherein said conversion means comprises means for generating a plurality of physical scanning addresses in response to said logical scanning address and each of said physical scanning addresses indicates a respective one of said data storage elements.

3. A scanning control apparatus according to claim 1, wherein said conversion means comprises means for generating sequentially a plurality of numbers which will constitute low-order addresses of said logical scanning address, address translation table means for providing a plurality of physical scanning addresses by being addressed by said logical scanning address and said plurality of low-order addresses, register means for holding a plurality of physical scanning addresses provided by said conversion table means; and output means for outputting sequentially said plurality of physical scanning addresses held in said register means.

4. A scanning control apparatus according to claim 3, wherein said information processing system consists of a plurality of packages each mounting a plurality of said data storage elements, each of said packages including decoder means, said conversion means further comprising decoder means which decodes a high-order address section of said physical scanning address given by said output means and activates the decoder means of one of said plurality of packages and means for supplying a low-order address section of said physical scanning address given by said output means commonly to the decoder means of said plurality of packages.

5. A scanning control apparatus according to claim 4, wherein said diagnostic control means comprises means for providing scan-in data made up of a plurality of bits, said conversion means further comprising latch means which holds said scan-in data in correspondence to said plurality of physical scanning addresses and means for outputting said scan-in data on a bit-by-bit basis in response to the sequential output of said plurality of physical scanning addresses.

6. A method of controlling the scanning operation for an information processing system consisting of a plurality of packages each mounting a plurality of data storage elements comprising:
   a first step of providing a logical scanning address;
   a second step of generating a physical scanning address in accordance with said logical scanning address; and
   a third step of performing scan-in or scan-out of data to or from ones of said data storage elements in correspondence to said physical scanning address.

7. A scanning control method according to claim 6, wherein said second step comprises a step of generating a plurality of physical scanning addresses in accordance with said logical scanning address.

8. A scanning control method according to claim 6, wherein said second step comprises a fourth step of generating sequentially a plurality of numbers which will constitute low-order addresses of said logical scanning address, and a fifth step of generating a plurality of physical scanning addresses in correspondence to said logical scanning address and said plurality of low-order addresses.

* * * * *